United States Patent
Wang

(10) Patent No.: US 10,520,359 B2
(45) Date of Patent: Dec. 31, 2019

(54) TERMINAL AND METHOD FOR DETECTING LUMINANCE OF AMBIENT LIGHT

(71) Applicant: Huawei Technologies Co., Ltd., Shenzhen (CN)

(72) Inventor: Xilin Wang, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 15/764,173

(22) PCT Filed: Sep. 28, 2015

(86) PCT No.: PCT/CN2015/090941
§ 371 (c)(1),
(2) Date: Mar. 28, 2018

(87) PCT Pub. No.: WO2017/054108
PCT Pub. Date: Apr. 6, 2017

(65) Prior Publication Data
US 2018/0274974 A1    Sep. 27, 2018

(51) Int. Cl.
*G01J 1/42* (2006.01)
*G01J 1/00* (2006.01)
(Continued)

(52) U.S. Cl.
CPC .............. *G01J 1/4204* (2013.01); *G01J 1/00* (2013.01); *G01J 1/44* (2013.01); *G06F 3/041* (2013.01);
(Continued)

(58) Field of Classification Search
CPC combination set(s) only.
See application file for complete search history.

(56) References Cited

U.S. PATENT DOCUMENTS 5,406,305 A * 4/1995 Shimomura ......... G09G 3/3406
345/102
2004/0032382 A1    2/2004    Cok et al.
(Continued)

FOREIGN PATENT DOCUMENTS

CN    101331532 A    12/2008
CN    101889304 A    11/2010
(Continued)

OTHER PUBLICATIONS

Foreign Communication From a Counterpart Application, European Application No. 15905020.2, Extended European Search Report dated Aug. 6, 2018, 8 pages.
(Continued)

*Primary Examiner* — Wesner Sajous
(74) *Attorney, Agent, or Firm* — Conley Rose, P.C.

(57) ABSTRACT

A terminal and a method for detecting luminance of ambient light, where the terminal includes a processor, an ambient light sensor, and a screen. The ambient light sensor and the screen are both coupled to the processor. A light-sensitive element of the ambient light sensor faces the screen and is located on a lower surface of the screen. After the screen is lit up, the processor adjusts first luminance of the screen to a value below a first threshold within a visual persistence time of human eyes. The ambient light sensor detects luminance of first ambient light of the terminal within the visual persistence time of human eyes. The terminal may eliminate non-ambient light that enters the ambient light sensor such that the ambient light sensor may detect luminance of relatively real ambient light.

20 Claims, 4 Drawing Sheets

(51) Int. Cl.
*G01J 1/44* (2006.01)
*G06F 3/041* (2006.01)
*G09G 5/10* (2006.01)
*G09G 5/02* (2006.01)
*H04N 1/60* (2006.01)
*H04N 5/57* (2006.01)
*H04N 9/69* (2006.01)
*H04N 9/73* (2006.01)
*H04N 9/77* (2006.01)
*G09G 3/20* (2006.01)
*G09G 3/3208* (2016.01)

(52) U.S. Cl.
CPC ......... *G09G 3/2007* (2013.01); *G09G 3/3208* (2013.01); *G09G 5/10* (2013.01); *G09G 2320/064* (2013.01); *G09G 2320/0626* (2013.01); *G09G 2354/00* (2013.01); *G09G 2360/144* (2013.01)

(56) References Cited

U.S. PATENT DOCUMENTS

| | | | |
|---|---|---|---|
| 2004/0095402 | A1 | 5/2004 | Nakano |
| 2008/0100645 | A1 | 5/2008 | Nitta |
| 2008/0191996 | A1* | 8/2008 | Toffoli ................. G09G 3/3406 345/102 |
| 2008/0284716 | A1 | 11/2008 | Edwards et al. |
| 2010/0128010 | A1 | 5/2010 | Katoh et al. |
| 2010/0201275 | A1 | 8/2010 | Cok et al. |
| 2010/0283765 | A1 | 11/2010 | Gotoh et al. |
| 2011/0063214 | A1 | 3/2011 | Knapp |
| 2011/0096084 | A1 | 4/2011 | Hu et al. |
| 2011/0128263 | A1* | 6/2011 | Abe ...................... G09G 3/3406 345/207 |
| 2013/0200808 | A1 | 8/2013 | Chang et al. |
| 2014/0132158 | A1 | 5/2014 | Land et al. |
| 2014/0168288 | A1 | 6/2014 | Tusch |
| 2015/0061501 | A1 | 3/2015 | Kim et al. |
| 2015/0194098 | A1 | 7/2015 | Kobayashi |
| 2016/0033795 | A1* | 2/2016 | Zhang ..................... G09G 3/36 345/690 |
| 2016/0180810 | A1* | 6/2016 | Maeda ................. H04B 10/116 345/589 |
| 2017/0110051 | A1 | 4/2017 | Gardner, Jr. |
| 2018/0084622 | A1 | 3/2018 | Chen |

FOREIGN PATENT DOCUMENTS

| | | |
|---|---|---|
| CN | 101911159 A | 12/2010 |
| CN | 102625944 A | 8/2012 |
| CN | 103137099 A | 6/2013 |
| CN | 103179271 A | 6/2013 |
| CN | 103220843 A | 7/2013 |
| CN | 103375700 A | 10/2013 |
| CN | 104240680 A | 12/2014 |
| CN | 104795054 A | 7/2015 |
| JP | 2004170721 A | 6/2004 |
| JP | 2007065004 A | 3/2007 |
| JP | 2007079113 A | 3/2007 |
| JP | 2008102499 A | 5/2008 |
| JP | 2008281894 A | 11/2008 |
| JP | 2010113008 A | 5/2010 |
| JP | 2010181455 A | 8/2010 |
| JP | 2012137859 A | 7/2012 |
| JP | 2012517618 A | 8/2012 |
| KR | 20080075862 A | 8/2008 |
| KR | 20110121621 A | 11/2011 |
| TW | 201115216 A | 5/2011 |

OTHER PUBLICATIONS

Machine Translation and Abstract of Chinese Publication No. CN103137099, Jun. 5, 2013, 19 pages.
Machine Translation and Abstract of Chinese Publication No. CN104240680, Dec. 24, 2014, 15 pages.
Foreign Communication From a Counterpart Application, Chinese Application No. 201580027989.8, Chinese Office Action dated Feb. 3, 2019, 14 pages.
Machine Translation and Abstract of Chinese Publication No. CN103179271, Jun. 26, 2013, 8 pages.
Machine Translation and Abstract of Chinese Publication No. CN104795054, Jul. 22, 2015, 15 pages.
Foreign Communication From a Counterpart Application, PCT Application No. PCT/CN2015/090941, English Translation of International Search Report dated Jul. 5, 2016, 4 pages.
Foreign Communication From a Counterpart Application, PCT Application No. PCT/CN2015/090941, English Translation of Written Opinion dated Jul. 5, 2016, 5 pages.
Machine Translation and Abstract of Japanese Publication No. JP2007065004, Mar. 15, 2007, 38 pages.
Machine Translation and Abstract of Japanese Publication No. JP2004170721, Jun. 17, 2004, 86 pages.
Machine Translation and Abstract of Japanese Publication No. JP2007079113, Mar. 29, 2007, 18 pages.
Machine Translation and Abstract of Japanese Publication No. JP2008281894, Nov. 20, 2008, 25 pages.
Machine Translation and Abstract of Japanese Publication No. JP2010113008, May 20, 2010, 24 pages.
Machine Translation and Abstract of Japanese Publication No. JP2010181455, Aug. 19, 2010, 31 pages.
Machine Translation and Abstract of Japanese Publication No. JP2012517618, Aug. 2, 2012, 34 pages.
Foreign Communication From a Counterpart Application, Japanese Application No. 2018-515998, Japanese Office Action dated Apr. 22, 2019, 6 pages.
Foreign Communication From a Counterpart Application, Japanese Application No. 2018-515998, English Translation of Japanese Office Action dated Apr. 22, 2019, 7 pages.
Foreign Communication From a Counterpart Application, European Application No. 15905020.2, European Office Action dated Apr. 24, 2019, 7 pages.
Machine Translation and Abstract of Korean Publication No. KR20080075862, Aug. 19, 2008, 20 pages.
Machine Translation and Abstract of Korean Publication No. KR20110121621, Nov. 7, 2011, 34 pages.
Foreign Communication From a Counterpart Application, Korean Application No. 10-2018-7011194, Korean Office Action dated Mar. 28, 2019, 7 pages.
Foreign Communication From a Counterpart Application, Korean Application No. 10-2018-7011194, English Translation of Korean Office Action dated Mar. 28, 2019, 7 pages.
Foreign Communication From a Counterpart Application, European Application No. 15905020.2, European Oral Proceedings dated Sep. 18, 2019, 7 pages.

* cited by examiner

TERMINAL AND METHOD FOR DETECTING LUMINANCE OF AMBIENT LIGHT

CROSS-REFERENCE TO RELATED APPLICATION

This application is a U.S. National Stage of International Patent Application No. PCT/CN2015/090941 filed on Sep. 28, 2015, which is hereby incorporated by reference in its entirety.

TECHNICAL FIELD

Embodiments of the present disclosure relate to the wireless communications field, and in particular, to a terminal and a method for detecting luminance of ambient light.

BACKGROUND

To ensure that human eyes can better observe screen content when a light ray changes, a terminal such as a mobile phone or a wearable device includes an ambient light sensor in order to detect luminance of external ambient light of the terminal. When the ambient light sensor detects that the luminance of the ambient light changes, the terminal adjusts luminance of a screen according to a detection result of the ambient light sensor in order to ensure that human eyes can better observe the screen.

When the ambient light sensor is disposed in the terminal and below the display screen, and detects an ambient light change using transmitted light, a detection result of the ambient light sensor is affected by an internal light ray of the display screen of the terminal, for example, backlight, or light that is obtained after a light ray of the screen is reflected on a surface of the screen. Consequently, a detection result of the ambient light sensor is inaccurate. For example, when the terminal is moved from a bright place to a dark place, because of impact of the internal light ray of the display screen of the terminal, the ambient light sensor cannot accurately detect the luminance of the ambient light.

SUMMARY

Embodiments of the present disclosure provide a terminal and a method for detecting luminance of ambient light such that an ambient light sensor of the terminal can detect luminance of ambient light relatively accurately.

According to a first aspect, an embodiment of the present disclosure provides a terminal, including a processor, an ambient light sensor, and a screen, where the ambient light sensor and the screen are both connected to the processor, a light-sensitive element of the ambient light sensor faces the screen and is located on a lower surface of the screen, after the screen is lit up, the processor adjusts first luminance of the screen to a value below a first threshold within a visual persistence time of human eyes, and the ambient light sensor detects luminance of first ambient light of the terminal within the visual persistence time of human eyes.

The terminal in this embodiment can reduce or eliminate non-ambient light that enters the ambient light sensor such that the ambient light sensor can detect relatively accurate luminance of ambient light.

In a possible implementation manner, the processor is further configured to restore the first luminance of the screen, and adjust the first luminance of the screen according to the luminance of the first ambient light.

In a possible implementation manner, the processor is further configured to adjust the first luminance of the screen according to the luminance of the first ambient light.

In the foregoing two possible implementation manners, the terminal adjusts the luminance of the screen according to a detection result of the ambient light sensor such that the luminance of the screen can better reflect an ambient light change, thereby improving user comfort.

In a possible implementation manner, after the ambient light sensor detects the luminance of the first ambient light of the terminal within the visual persistence time of human eyes, the processor restores the first luminance of the screen, controls a time length of the first luminance of the screen to fall within a first preset range, and adjusts the first luminance to a value below the first threshold within the visual persistence time of human eyes. The ambient light sensor detects luminance of second ambient light of the terminal within the visual persistence time of human eyes, and the processor adjusts the first luminance of the screen according to the luminance of the first ambient light and the luminance of the second ambient light that are detected by the ambient light sensor.

Because the first luminance of the screen is adjusted according to results of two times of detection on the luminance of the ambient light, the first luminance is adjusted more accurately.

In a possible implementation manner, the terminal further determines a difference between the luminance of the first ambient light and the luminance of the second ambient light, detects luminance of third ambient light according to a method for detecting the luminance of the first ambient light if the difference is greater than or equal to a second threshold, and continues to detect luminance of ambient light until a difference between results of two consecutive times of detection on luminance of ambient light is less than or equal to the second threshold if a difference between the luminance of the third ambient light and the luminance of the second ambient light is still greater than or equal to the second threshold, and the first luminance of the screen is adjusted according to the results of the two consecutive times of detection on luminance of ambient light.

Because luminance of ambient light is determined according to small-error results of two consecutive times of detection on luminance of ambient light, a detection result of the luminance of the ambient light is more accurate.

In a possible implementation manner, that the processor adjusts the first luminance of the screen according to the luminance of the first ambient light includes, if the luminance of the first ambient light is less than luminance that is of ambient light and that is detected by the ambient light sensor last time, the processor is further configured to detect whether there is a screen touch operation, and adjusts the first luminance of the screen according to the luminance of the first ambient light if there is no touch operation.

Because it is further determined whether there is a user's screen touch operation, a detection error is reduced.

In a possible implementation manner, that the processor adjusts the first luminance of the screen to the value below the first threshold includes, when the screen is an organic light-emitting diode (OLED) screen, the processor adjusts luminance of the OLED screen to a value below the first threshold.

In a possible implementation manner, that the processor adjusts the first luminance of the screen to the value below the first threshold includes that the processor adjusts, to a value below the first threshold, luminance of a screen area in which the ambient light sensor is located.

In a possible implementation manner, the first threshold is 50 candelas per square centimetre ($cd/cm^2$).

In a possible implementation manner, the terminal further includes an epoxy resin adhesive layer, and the epoxy resin adhesive layer is located on the lower surface of the screen, and the ambient light sensor is disposed in a hollow-out area of the epoxy resin adhesive layer, where the screen is the OLED screen.

According to a second aspect, an embodiment of the present disclosure provides a terminal, including a processor, an ambient light sensor, and a screen, where the ambient light sensor and the screen are both connected to the processor, a light-sensitive element of the ambient light sensor faces the screen and is located on a lower surface of the screen, and after the screen is lit up, the processor controls image data within a visual persistence time of human eyes so that a grayscale value of the controlled image data is less than or equal to a first threshold, and the ambient light sensor detects luminance of first ambient light of the terminal within the visual persistence time of human eyes.

The terminal in this embodiment can reduce or eliminate non-ambient light that enters the ambient light sensor such that the ambient light sensor can detect relatively accurate luminance of ambient light.

In a possible implementation manner, that the processor controls the image data so that the grayscale value of the controlled image data is less than or equal to the first threshold includes that the processor adjusts image data displayed on the screen such that a grayscale value of the adjusted image data is less than or equal to the first threshold.

In a possible implementation manner, that the processor controls the image data so that the grayscale value of the controlled image data is less than or equal to the first threshold includes that the processor inserts image data, where a grayscale value of the inserted image data is less than or equal to the first threshold.

In the foregoing two possible implementation manners, the terminal controls image data in two manners so that a grayscale value of the image data is small enough. This prevents the image data from affecting a detection result of the ambient light sensor such that the ambient light sensor can detect luminance of relatively real ambient light.

In a possible implementation manner, the processor is further configured to adjust the grayscale value of the image data according to the luminance of the first ambient light.

In a possible implementation manner, that the processor adjusts the grayscale value of the image data according to the luminance of the first ambient light includes that, if the luminance of the first ambient light is less than luminance that is of ambient light and that is detected by the ambient light sensor last time, the processor is further configured to detect whether there is a screen touch operation, and if there is no touch operation, the processor adjusts the grayscale value of the image data according to the luminance of the first ambient light.

Because it is further determined whether there is a user's screen touch operation, a detection error is reduced.

In a possible implementation manner, that the processor controls the image data includes that the processor controls all image data in a screen area, or the processor controls image data in a screen area in which the ambient light sensor is located.

In a possible implementation manner, the first threshold is red green blue (RGB) (50, 50, 50).

In a possible implementation manner, the terminal further includes an epoxy resin adhesive layer, and the epoxy resin adhesive layer is located on the lower surface of the screen, and the ambient light sensor is disposed in a hollow-out area of the epoxy resin adhesive layer, where the screen is an OLED screen.

According to a third aspect, an embodiment of the present disclosure provides a method for detecting luminance of ambient light, including adjusting, by the terminal, first luminance of the screen to a value below a first threshold within a visual persistence time of human eyes after a screen is lit up, and detecting, by an ambient light sensor of the terminal, luminance of first ambient light of the terminal within the visual persistence time of human eyes.

In a possible implementation manner, after detecting, by an ambient light sensor of the terminal, luminance of first ambient light of the terminal within the visual persistence time of human eyes, the method further includes restoring, by the terminal, the first luminance of the screen, and adjusting, by the terminal, the first luminance of the screen according to the luminance of the first ambient light.

In a possible implementation manner, after detecting, by an ambient light sensor of the terminal, luminance of first ambient light of the terminal within the visual persistence time of human eyes, the method further includes adjusting, by the terminal, the first luminance of the screen according to the luminance of the first ambient light.

In a possible implementation manner, after detecting, by an ambient light sensor of the terminal, luminance of first ambient light of the terminal within the visual persistence time of human eyes, the method further includes restoring, by the terminal, the first luminance of the screen, controlling, by the terminal, a time length of the first luminance of the screen to fall within a first preset range, adjusting, by the terminal, the first luminance to a value below the first threshold within the visual persistence time of human eyes, detecting, by the ambient light sensor, luminance of second ambient light of the terminal within the visual persistence time of human eyes, and adjusting, by the terminal, the first luminance of the screen according to the luminance of the first ambient light and the luminance of the second ambient light that are detected by the ambient light sensor.

In a possible implementation manner, adjusting, by the terminal, the first luminance of the screen according to the luminance of the first ambient light includes, if the luminance of the first ambient light is less than luminance that is of ambient light and that is detected last time, detecting, by the terminal, whether there is a screen touch operation, and if there is no touch operation, adjusting, by the terminal, the first luminance of the screen according to the luminance of the first ambient light.

In a possible implementation manner, adjusting, by the terminal, first luminance of the screen to a value below a first threshold includes, when the screen is an OLED screen, adjusting, by the terminal, luminance of the OLED screen to a value below the first threshold, or when the screen is a liquid crystal display (LCD) screen, adjusting, by the terminal, backlight luminance of the LCD screen to a value below the first threshold.

In a possible implementation manner, adjusting, by the terminal, first luminance of the screen to a value below a first threshold includes adjusting, by the terminal to a value below the first threshold, luminance of a screen area in which the ambient light sensor is located.

In a possible implementation manner, the first threshold is 50 $cd/cm^2$.

According to a fourth aspect, an embodiment of the present disclosure provides a method for detecting luminance of ambient light, including controlling, by the terminal, image data within a visual persistence time of human eyes after a screen of a terminal is lit up such that a grayscale value of the controlled image data is less than or equal to a first threshold, and detecting, by an ambient light sensor of the terminal, luminance of first ambient light of the terminal within the visual persistence time of human eyes.

In a possible implementation manner, controlling, by the terminal, image data so that a grayscale value of the controlled image data is less than or equal to a first threshold includes adjusting, by the terminal, image data displayed on the screen such that a grayscale value of the adjusted image data is less than or equal to the first threshold.

In a possible implementation manner, controlling, by the terminal, image data so that a grayscale value of the controlled image data is less than or equal to a first threshold includes inserting, by the terminal, image data, where a grayscale value of the inserted image data is less than or equal to the first threshold.

In a possible implementation manner, after detecting, by an ambient light sensor of the terminal, luminance of first ambient light of the terminal, the method further includes adjusting, by the terminal, the grayscale value of the image data according to the luminance of the first ambient light.

In a possible implementation manner, adjusting, by the terminal, the grayscale value of the image data according to the luminance of the first ambient light includes, if the luminance of the first ambient light is less than luminance that is of ambient light and that is detected by the ambient light sensor last time, detecting, by the terminal, whether there is a screen touch operation, and if there is no touch operation, adjusting, by the terminal, the grayscale value of the image data according to the luminance of the first ambient light.

In a possible implementation manner, controlling, by the terminal, image data includes controlling, by the terminal, all image data in a screen area, or controlling, by the terminal, image data in a screen area in which the ambient light sensor is located.

In a possible implementation manner, the first threshold is RGB (50, 50, 50).

The terminal in the embodiments of the present disclosure can eliminate non-ambient light that enters an ambient light sensor such that the ambient light sensor can detect luminance of real ambient light relatively accurately.

DESCRIPTION OF EMBODIMENTS

The following clearly describes the technical solutions in the embodiments of the present disclosure with reference to the accompanying drawings in the embodiments of the present disclosure. The described embodiments are only some but not all of the embodiments of the present disclosure. All other embodiments obtained by a person of ordinary skill in the art based on the embodiments of the present disclosure without creative efforts shall fall within the protection scope of the present disclosure.

When ordinal numbers such as "first" and "second" are mentioned in the embodiments of the present disclosure, it should be understood that the ordinal numbers are intended only for differentiation unless a meaning of order is determined according to context.

A terminal involved in the embodiments of the present disclosure includes a wearable device, a mobile phone, a tablet computer, a notebook computer, an ultra-mobile personal computer (UMPC), a netbook, a personal digital assistant (PDA), or the like. A wearable device is used as an example in the following to describe all the embodiments of the present disclosure.

Common product forms of wearable devices include a wrist-supported watch class (including watches, hand rings, wrist straps, and the like), a foot-supported shoe class (including shoes, socks, or other future products worn on a leg), a head-supported glass class (including glasses, helmets, head bands, and the like), smart clothes, bags, crutches, accessories, and the like. It may be understood that an ambient light detection method provided in the embodiments of the present disclosure can be used for all terminals that include display screens and that have user-visible display functions.

Figure 1:
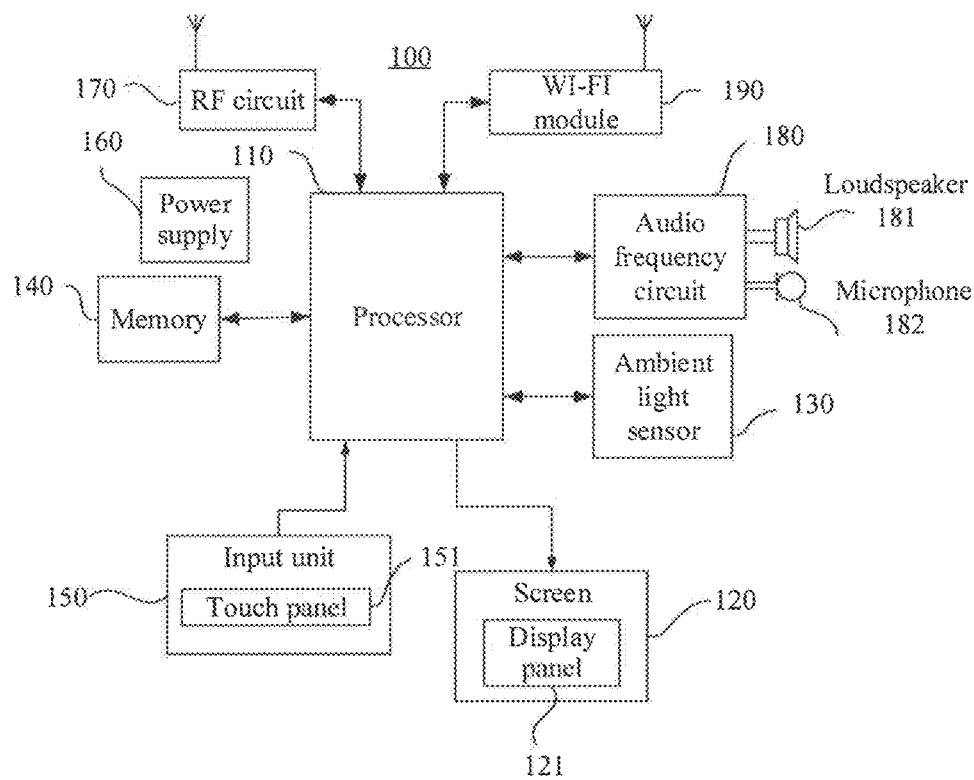
FIG. 1 is a schematic circuit diagram of a wearable device according to an embodiment of the present disclosure.

FIG. 1 is a schematic circuit diagram of a wearable device according to an embodiment of the present disclosure. As shown in FIG. 1, a wearable device 100 includes components such as a processor 110, a screen 120, and an ambient light sensor 130. The wearable device 100 may further include components such as a memory 140, an input unit 150, and a power supply 160. A person skilled in the art may understand that a structure of the wearable device 100 shown in FIG. 1 does not constitute any limitation to the wearable device 100, and the wearable device 100 may include components more or less than those shown in FIG. 1, or a combination of some components, or components disposed differently.

The following provides specific descriptions for all constituent components of the wearable device 100 with reference to FIG. 1.

The processor 110 is a control center of the wearable device 100, and is connected to all components of the entire wearable device 100 using various interfaces and lines. By running or executing a software program and/or module stored in the memory 140 and invoking data stored in the memory 140, the processor 110 executes various functions of the wearable device 100 and processes data in order to perform overall monitoring on the wearable device 100. The processor 110 may be an application processor, a baseband processor, or a baseband processor and an application processor that are integrated, or the processor 110 includes a baseband processor and an application processor. The application processor mainly processes an operating system, a user interface, an application program, and the like. The baseband processor is responsible for processing and storing data, mainly has components such as a digital signal processor, a microcontroller, and a memory, and mainly has functions such as baseband encoding/decoding, sound encoding, and voice encoding. As technologies develop, the baseband processor may further provide a multimedia function and related interfaces used for a multimedia display, an image sensor, and an audio device.

The screen 120 may be configured to display information entered by a user or information provided for a user, or may display various menus of the wearable device 100. The screen 120 may include a display panel 121. Optionally, the display panel 121 may be configured in a form such as an LCD or an OLED.

Further, a touch panel 151 of an input unit 150 can cover the screen 120. After detecting a touch operation on or near the touch panel 151, the touch panel 151 may transfer the touch operation to the processor 110 using a Mobile Industry Processor Interface (MIPI) in order to determine a touch event type. Then, the processor 110 provides corresponding visual output on the screen 120 according to the touch event type. In FIG. 1, the touch panel 151 and the screen 120 are used as two independent components to implement input and display functions of the wearable device 100. However, in some embodiments, the touch panel 151 and the screen 120 may be integrated to implement the input and display functions of the wearable device 100.

The ambient light sensor 130 may detect luminance of ambient light. The wearable device 100 may adjust luminance of the display panel 121 according to the luminance of the ambient light. Further, the wearable device 100 may further include another sensor such as a light sensor, a motion sensor, a density sensor, or a fingerprint sensor. Further, the light sensor may include a sensor other than the ambient light sensor 130, for example, a proximity sensor, and may detect whether an object is approaching or coming into contact with the wearable device 100 such that the wearable device 100 can turn off the display panel 121 and/or backlight when the wearable device 100 is moved to an ear. As a motion sensor, an accelerometer sensor may detect values of acceleration in all directions (generally in three axes), may detect a value and a direction of gravity at rest, and may be applied to an application for recognizing a posture of the wearable device 100 (for example, screen switching between a landscape mode and a portrait mode, related games, and magnetometer posture calibration), a function related to vibration recognition (for example, a pedometer or a knock), and the like. The density sensor may detect a density of an object that is in contact with the wearable device 100. The fingerprint sensor is configured to collect a fingerprint entered by a user. For another sensor that may be further configured in the wearable device 100, such as a gyroscope, a barometer, a hygrometer, a thermometer, or an infrared sensor, details are not described herein.

The memory 140 may be configured to store a software program or module. By running the software program or module stored in the memory 140, the processor 110 executes various functional applications of the wearable device 100 and processes data. The memory 140 may mainly include a program storage area and a data storage area. The program storage area may store an operating system, an application program required for at least one function (for example, a sound playback function or an image display function), and the like. The data storage area may store data (for example, audio data and image data) created according to use of the wearable device 100, and the like. In addition, the memory 140 may be a high-speed random access memory (RAM), or may be a non-volatile memory, such as at least one disk storage device, a flash memory device, or a solid-state storage device.

The wearable device 100 further includes the power supply 160 (such as a battery) that supplies power to all the components. The power supply 160 may be logically connected to the processor 110 using a power supply management system in order to implement functions such as charging and discharging management, and power consumption management using the power supply management system.

The wearable device 100 may further include a radio frequency (RF) circuit 170, an audio frequency circuit 180 including loudspeaker 181 and a microphone 182, a WI-FI module 190, and the like, and details are not described herein.

Generally, when not being used, the wearable device 100 is in a standby mode, and nothing is displayed on the screen 120. When a user needs to browse content displayed on the screen 120, the wearable device 100 is triggered to light up the screen 120. In a process in which the user browses the content continuously, after the wearable device 100 is moved, luminance of external light, that is, ambient light of the wearable device 100 may change. In order that a user browses screen content better, the wearable device 100 adjusts luminance of the screen 120 according to a result of detecting the luminance of the ambient light by the ambient light sensor.

First Embodiment

Figure 2:
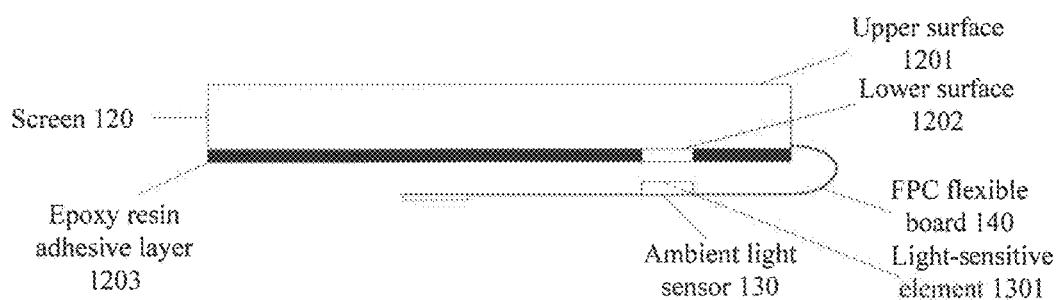
FIG. 2 is a schematic structural diagram of a wearable device according to an embodiment of the present disclosure.

An OLED screen is used as an example. FIG. 2 is a schematic structural diagram of a wearable device according to an embodiment of the present disclosure. As shown in FIG. 2, a screen 120 has an upper surface 1201 and a lower surface 1202. An epoxy resin adhesive layer 1203 is located on the lower surface 1202 of the screen 120. An ambient light sensor 130 is disposed in a hollow-out area of the epoxy resin adhesive layer 1203. The ambient light sensor 130 may be disposed on a flexible printed circuit (FPC) flexible board 140. A light-sensitive element 1301 of the ambient light sensor 130 faces the screen 120 and is located on the lower surface 1202 of the screen 120. The ambient light sensor 130 and the screen 120 may be both connected to a processor using the FPC flexible board 140.

It may be understood that the epoxy resin adhesive layer 1203 in this embodiment may have different names according to different functions of the epoxy resin adhesive layer 1203, for example, a light-shielding epoxy resin adhesive layer having a light shielding function, a buffering epoxy resin adhesive layer having a buffering function, or a buffering and light-shielding epoxy resin adhesive layer having buffering and light shielding functions. The epoxy resin adhesive layer 1203 may be bonded to or directly placed on the lower surface 1202 of the screen 120. That is, the epoxy resin adhesive layer 1203 in this embodiment is unnecessarily adhesive, and this is not limited herein.

When the ambient light sensor 130 detects luminance of ambient light, the detected luminance of the ambient light is luminance of external ambient light that penetrates through the screen 120 and that is transmitted to the light-sensitive element 1301 of the ambient light sensor 130. Therefore, during screen display, the ambient light sensor 130 is affected by light emitted by the screen 120 or backlight of the screen 120. In this case, a detection result of the ambient light sensor 130 includes not only the luminance of the ambient light of the wearable device, but also luminance of the light emitted by the screen 120 or the backlight of the screen 120.

Figure 3:
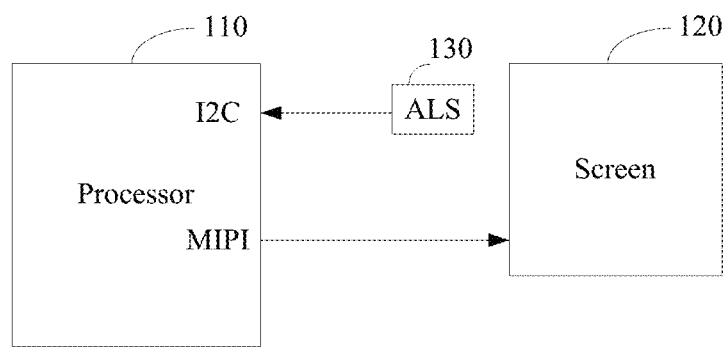
FIG. 3 is a schematic circuit diagram of a wearable device according to an embodiment of the present disclosure.

To obtain more accurate luminance of ambient light of a wearable device, an embodiment of the present disclosure provides a wearable device, including a processor 110, an ambient light sensor 130 (designated as ALS 130 in FIG. 3), and a screen 120. FIG. 3 is a schematic circuit diagram of the wearable device according to this embodiment of the present disclosure. The ambient light sensor 130 and the screen 120 are both connected to the processor 110. Certainly, the processor 110 may be one processor, or may be a set of multiple processors. For example, the processor 110 includes an application processor and a baseband processor. The application processor and the baseband processor may be separately disposed, or may be integrated, and this is not limited in this embodiment of the present disclosure. In this embodiment, the processor 110 may be an application processor. It may be understood that the ambient light sensor 130 and the screen 120 may be both connected to the processor 110 directly or indirectly, and this is not limited in this embodiment of the present disclosure.

After the screen 120 of the wearable device provided in this embodiment of the present disclosure is lit up, the processor 110 adjusts first luminance of the screen 120 to a value below a first threshold within a visual persistence time of human eyes. The ambient light sensor 130 detects luminance of first ambient light of the wearable device within the visual persistence time of human eyes.

When an object is viewed by human eyes, the object is imaged to the retina, and input to the brain using the optic nerve such that the human eyes perceive an image of the object. The visual persistence time of human eyes means that an impression of the optic nerve on the object does not disappear immediately but lasts approximately ¼24 second (s) after removal of the object. The time, ¼24 s, is the visual persistence time of human eyes. That is, within 40 milliseconds (ms) after an image appears or disappears, an impression of the optic nerve on an object does not disappear, and consequently, recognition of the image by the human eyes is not affected. Therefore, the visual persistence time of human eyes may be ¼24 s or 40 ms.

The first threshold of the luminance of the screen 120 means that almost no light emitted by the screen 120 or backlight enters the ambient light sensor 130 when the luminance is below the luminance threshold. When the luminance is below the luminance threshold, the ambient light sensor 130 can detect luminance of relatively real ambient light. In this case, luminance of non-ambient light that can enter the ambient light sensor 130 is almost zero. The first threshold may be 50 candelas/square meter (cd/m$^2$). That the processor 110 adjusts the first luminance of the screen 120 to the value below the first threshold may include that the processor 110 adjusts the first luminance of the screen to 50 cd/m$^2$, or the processor 110 adjusts the first luminance of the screen 120 to 40 cd/m$^2$. It may be learned that the value below the first threshold includes the first threshold. In addition, the first threshold may be set according to an actual case.

The first luminance of the screen 120 generally refers to luminance of the screen 120 when the screen 120 is lit up.

Alternatively, the screen 120 may be an LCD screen. Because light-emitting principles of the OLED screen and the LCD screen are different, that the processor 110 adjusts the first luminance of the screen 120 to the value below the first threshold may include different processing manners for different screens. Examples are as follows.

When the screen 120 is an OLED screen, the processor 110 adjusts luminance of the OLED screen to a value below the first threshold. Because an OLED displays in a self-luminous manner, luminance of the OLED is adjusted by the processor 110 by controlling a luminance adjustment register in the OLED. In this case, when the luminance of the screen 120 is adjusted to a value below the first threshold, the processor 110, for example, an application processor, may directly adjust the luminance of the screen 120 by controlling the luminance adjustment register such that the luminance of the screen 120 is less than or equal to the first threshold.

When the screen 120 is an LCD screen, the processor 110 adjusts backlight luminance of the LCD screen to a value below the first threshold. Because the LCD screen illuminates using backlight, when the luminance of the screen 120 is adjusted to a value below the first threshold, the processor 110, for example, an application processor, may adjust the backlight luminance such that the luminance of the screen 120 is less than or equal to the first threshold.

Further, in this embodiment of the present disclosure, that the processor 110 adjusts the first luminance of the screen 120 to the value below the first threshold may not only include adjusting luminance of the entire screen 120 to a value below the first threshold, but also include adjusting, to a value below the first threshold, luminance of a screen area in which the ambient light sensor 130 is located, provided that it is ensured that when the ambient light sensor 130 performs detection, luminance that enters a light-sensitive element of the ambient light sensor is not affected by light emitted by the screen 120 or backlight of the screen 120.

In this embodiment of the present disclosure, the luminance of the screen 120 may be the first luminance when the screen 120 is lit up. When the processor 110 adjusts the first luminance of the screen 120 to a value below the first threshold within the visual persistence time of human eyes, the ambient light sensor completes detection on the luminance of the ambient light of an environment in which the wearable device is located.

That is, after the screen 120 is lit up, when the processor 110 adjusts the luminance of the screen 120 to an excessively small value so that an internal light ray of the screen 120 such as backlight or a light ray emitted by the screen 120 can be ignored, the ambient light is detected. This can ensure that a light ray that enters the ambient light sensor 130 is real ambient light. In addition, in order not to affect observation on the screen 120 with human eyes, the two processes of adjusting the luminance of the screen 120 to a value below the first threshold and detecting, by the ambient light sensor 130, the luminance of the ambient light of the wearable device need to be completed within the visual persistence time of human eyes. In this embodiment of the present disclosure, in this way, in a process in which the screen 120 of the wearable device is lit up to display screen content, non-ambient light that enters the ambient light sensor 130 can be eliminated without being perceived by the human eyes such that the ambient light sensor 130 can detect the luminance of the ambient light relatively accurately.

Further, according to the wearable device in this embodiment of the present disclosure, after the ambient light sensor 130 detects the luminance of the first ambient light of the wearable device within the visual persistence time of human eyes, the processor 110 is further configured to adjust the first luminance of the screen 120 according to the luminance of the first ambient light.

After the ambient light sensor 130 completes detection on the luminance of the first ambient light, the processor 110 may adjust the first luminance of the screen 120 according to a detection result of the ambient light sensor 130 such that the luminance of the screen 120 is adjusted to second luminance corresponding to the luminance that is of the ambient light and that is detected by the ambient light sensor 130. In this way, the ambient light sensor 130 completes one time of detection, and the processor 110 completes one adjustment to the luminance of the screen 120.

It should be noted that if luminance that is of ambient light and that is detected by the ambient light sensor 130 does not change in one time of detection, an amplitude of adjustment to the luminance of the screen 120 by the processor 110 may be zero. If luminance that is of ambient light and that is detected by the ambient light sensor 130 is greater than last-time luminance of ambient light, the processor 110 may adjust the luminance of the screen 120 to a larger value according to a correspondence between the luminance of the ambient light and the luminance of the screen 120. If luminance that is of ambient light and that is detected by the ambient light sensor 130 is less than last-time luminance of ambient light, the processor 110 may adjust the luminance of the screen 120 to a smaller value according to a correspondence between the luminance of the ambient light and the luminance of the screen 120. The correspondence between the luminance of the ambient light and the luminance of the screen 120 may be obtained by means of testing, or may be obtained by means of continuous learning. The correspondence may be stored in a terminal in advance.

It should be noted that when the wearable device is always in a screen-on state, the luminance of the ambient light of the environment in which the wearable device is located may be detected continuously in a first predetermined cycle. The first predetermined cycle may be, for example, greater than or equal to 1 s, and less than or equal to 2 s. That is, in the first predetermined cycle, within the visual persistence time of human eyes, the luminance of the screen 120 is adjusted to a value below the first threshold, the luminance of the ambient light is detected, and the luminance of the screen 120 is adjusted according to the detected luminance of the ambient light such that the processor 110 can adjust the luminance of the screen 120 according to the luminance of the ambient light to ensure observation comfort of the human eyes.

Optionally, after the ambient light sensor 130 detects the luminance of the first ambient light of the wearable device within the visual persistence time of human eyes, the processor 110 may first restore the first luminance of the screen 120 and then adjust the first luminance of the screen 120 according to the luminance of the first ambient light. Certainly, as described above, alternatively, the processor 110 may directly adjust the first luminance of the screen 120 according to the luminance of the first ambient light.

It may be understood that if a time length between adjusting the first luminance of the screen 120 to a value below the first threshold by the processor 110 and completing detection on the luminance of the ambient light by the ambient light sensor 130 is less than the visual persistence time of human eyes, the processor 110 may restore the first luminance of the screen immediately after the ambient light sensor 130 completes detection on the luminance of the ambient light. The processor 110 may alternatively restore the first luminance of the screen 120 when the visual persistence time of human eyes expires. After the first luminance of the screen 120 is restored, the processor 110 adjusts the first luminance of the screen according to a detection result of the ambient light sensor 130.

The luminance of the screen 120 is adjusted according to the detection result of the ambient light sensor 130 such that the luminance of the screen 120 can better reflect an ambient light change, thereby improving user comfort.

Figure 4:
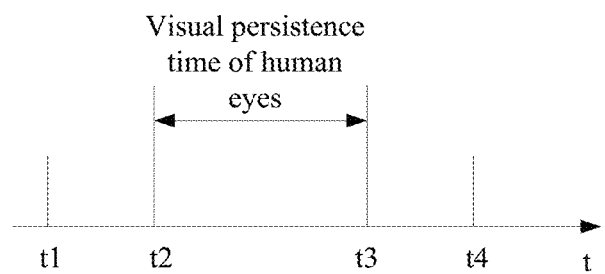
FIG. 4 is a schematic diagram of an execution time for detecting ambient light by a wearable device according to an embodiment of the present disclosure.

The following describes, with reference to FIG. 4, a process in which the ambient light sensor detects the ambient light of the wearable device. FIG. 4 is a schematic diagram of an execution time for detecting ambient light by a wearable device according to an embodiment of the present disclosure.

At a moment t1, the screen of the wearable device is lit up. Luminance may be the first luminance, that is, luminance of the screen when the screen is lit up.

The processor, for example, an application processor starts to adjust the luminance of the screen at a moment t2.

Within a time period between t2 and t3, the processor first adjusts the luminance of the screen to 40 $cd/cm^2$, that is, a value below the first threshold. When the screen is under the luminance, the luminance of the screen may be ignored, and impact on the ambient light sensor may also be ignored. Under the luminance, the ambient light sensor starts to measure the ambient light of the wearable device. After receiving a detection execution command sent by the processor, the ambient light sensor measures the ambient light of the wearable device and obtains a detection result. After completing measurement on the luminance of the ambient light of the wearable device, the ambient light sensor feeds back the measured luminance of the first ambient light to the processor. A time length of the time period between t2 and t3 is less than or equal to the visual persistence time of human eyes, and preferably, may be 10-30 ms. That is, both adjusting, by the processor, the luminance of the screen to a value below the first threshold and detecting, by the ambient light sensor, the ambient light of the wearable device are completed within the time period between t2 and t3.

After receiving a detection complete message fed back by the ambient light sensor, the processor may first restore the first luminance of the screen at the moment t3.

Within a time period between t3 and t4, the processor may calculate or obtain, by searching a preset correspondence table or in another manner, luminance that is of the screen corresponding to the luminance of the first ambient light, according to the detected luminance of the first ambient light, and adjust, at the moment t4, the screen to the luminance that is of the screen corresponding to the luminance of the first ambient light.

Optionally, the process in which the processor calculates or obtains, by searching the preset correspondence table or in another manner, the luminance that is of the screen corresponding to the luminance of the first ambient light, according to the detected luminance of the first ambient light may be completed within the time period between t2 and t3. In this case, the processor adjusts the luminance of the screen at the moment t3 according to the obtained luminance that is of the screen corresponding to the luminance of the first ambient light.

According to the wearable device in this embodiment of the present disclosure, a time length of a time period between t1 and t3 or between t1 and t4 may be used as a first predetermined cycle, and the processor completes adjustment to the luminance of the screen at the moment t3 or the moment t4. It may be understood that in the first predetermined cycle, the wearable device may repeat the foregoing detection on the luminance of the ambient light of the wearable device in order to ensure that when the environment in which the wearable device is located changes, the ambient light sensor can detect an environment change in a timely manner, and the processor can adjust the luminance of the screen in a timely manner according to a detection result of the ambient light sensor.

It should be noted that because the ambient light sensor detects ambient light transmitted from the screen, if a user operates on the screen with a finger, the ambient light transmitted to the ambient light sensor is affected. Consequently, detection by the ambient light sensor is inaccurate.

To avoid a detection error brought by such an operation, in this embodiment of the present disclosure, that the processor adjusts the first luminance of the screen according to the luminance of the first ambient light may include that if the luminance of the first ambient light is less than luminance that is of ambient light and that is detected by the ambient light sensor last time, the processor is further configured to detect whether there is a screen touch operation, and if there is no touch operation, the processor adjusts the first luminance of the screen according to the luminance of the first ambient light.

That is, that the luminance of the first ambient light is less than the luminance that is of the ambient light and that is detected last time may be caused by a user's screen touch operation. In this case, the processor is further configured to determine whether there is a screen touch operation. If there is no screen touch operation, it indicates that the detection is accurate, and the processor may adjust the luminance of the screen according to the detected luminance of the first ambient light. If there is a screen touch operation, it indicates that a detection result may be affected by the user's screen touch operation, and therefore, this detection result is abandoned, and an adjustment amplitude of the luminance of the screen may be zero. The operation of determining whether there is a screen touch operation may be performed using other approaches, and details are not described herein.

Because it is further determined whether there is a user's screen touch operation, a detection error is reduced.

Optionally, according to the wearable device in this embodiment of the present disclosure, after the ambient light sensor detects the luminance of the first ambient light of the wearable device within the visual persistence time of human eyes, the processor may restore the first luminance of the screen, the processor controls a time length of the first luminance of the screen to fall within a first preset range, the processor adjusts the first luminance to a value below the first threshold within the visual persistence time of human eyes, the ambient light sensor detects luminance of second ambient light of the wearable device within the visual persistence time of human eyes, and the processor adjusts the first luminance of the screen according to the luminance of the first ambient light and the luminance of the second ambient light that are detected by the ambient light sensor.

Further, after the ambient light sensor completes detection on the luminance of the first ambient light, the processor records a detection result of the first ambient light and restores the first luminance of the screen. After the screen is restored to the first luminance, the screen displays for a period of time under the first luminance, to ensure that the human eyes can view screen content, and then, a process of detecting luminance of ambient light is executed again. That is, within the visual persistence time of human eyes, the first luminance of the screen is adjusted to a value below the first threshold, and the ambient light sensor detects the luminance of the second ambient light to obtain the luminance of the second ambient light. In this case, the processor determines the luminance of the ambient light of the wearable device according to the luminance of the first ambient light and the luminance of the second ambient light, and the processor adjusts the first luminance of the screen according to the determined luminance of the ambient light.

That the processor determines the luminance of the ambient light of the wearable device according to the luminance of the first ambient light and the luminance of the second ambient light may include for example, the processor sets, as the determined luminance of the ambient light of the wearable device, a result obtained after averaging the luminance of the first ambient light and the luminance of the second ambient light. Then, the processor may adjust the first luminance of the screen according to the determined luminance of the ambient light.

To ensure that the subsequently detected luminance of the second ambient light and the luminance of the first ambient light are obtained in a same ambient light condition, a time length for display of screen content needs to be controlled to fall within the first preset range. The first preset range refers to a time length range within which a screen-on time length can ensure that a user can obtain the screen content. If a time length of the restored first luminance of the screen is less than the first preset range, the luminance of the screen is adjusted to a value below the first threshold again. Because of the visual persistence time of human eyes, the user may be still in a visual state in which the luminance of the screen is below the first threshold and the screen is approximately blank, and obtaining of the screen content by the user is affected. Therefore, in this embodiment of the present disclosure, the first preset range meets, for example, the following condition, 2× the visual persistence time of human eyes≤the first preset range≤1 s.

Briefly, within the visual persistence time of human eyes, the first luminance of the screen is adjusted to a value below the first threshold, and the ambient light sensor detects the luminance of the first ambient light. The processor restores the first luminance of the screen and keeps the first luminance for a time length in which the human eyes can obtain the screen content. Then, after the processor adjusts the first luminance of the screen to a value below the first threshold within the visual persistence time of human eyes, the ambient light sensor detects the luminance of the second ambient light. In this way, the processor adjusts the first luminance of the screen according to the luminance of the first ambient light and the luminance of the second ambient light that are detected by the ambient light sensor.

A detection result is more accurate because the luminance of the ambient light of the wearable device is determined using results of two times of detection on the luminance of the ambient light.

To further improve accuracy of the detection result, the following technical solution of obtaining the luminance of the ambient light of the wearable device is further used in this embodiment of the present disclosure.

After the ambient light sensor completes detection on luminance of first ambient light, the processor records a detection result of the luminance of the first ambient light, and the processor restores first luminance of the screen and keeps the first luminance for a first preset range, for example, ⅙ s, and then executes a process of detecting luminance of ambient light again, that is, within a visual persistence time of human eyes, the first luminance of the screen is adjusted to a value below a first threshold, and the ambient light sensor detects luminance of second ambient light to obtain the luminance of the second ambient light. When a difference between the luminance of the first ambient light and the luminance of the second ambient light is greater than or equal to a second threshold, for example, 50 cd/m², it is considered that at least one of the luminance of the first ambient light or the luminance of the second ambient light is inaccurate, and the former detection result, that is, the detection result of the luminance of the first ambient light is abandoned. Luminance of third ambient light is detected according to a method for detecting the luminance of the first ambient light, that is, within the visual persistence time of human eyes, the first luminance of the screen is adjusted to a value below the first threshold, and the ambient light sensor detects luminance of ambient light to obtain the luminance of the third ambient light. If a difference between the luminance of the second ambient light and the luminance of the third ambient light is still greater than or equal to the second threshold, a step of detecting ambient light is repeated until a difference between results of two consecutive times of detection on luminance of ambient light is less than the second threshold, and the luminance of the ambient light of the wearable device is determined according to the results of the two consecutive times of detection on the luminance of the ambient light. For example, the luminance of the ambient light may be determined in a manner in which results of two consecutive times of detection on luminance of ambient light are averaged. The processor adjusts the first luminance of the screen according to the finally determined luminance of the ambient light.

Because luminance of ambient light is determined according to small-error results of two consecutive times of detection on luminance of ambient light, a detection result of the luminance of the ambient light is more accurate.

Second Embodiment

Referring to FIG. 2 and FIG. 3, the second embodiment of the present disclosure further provides a wearable device. The wearable device includes a processor 110, an ambient light sensor 130, and a screen 120. The ambient light sensor 130 and the screen 120 are both connected to the processor 110. A light-sensitive element 1301 of the ambient light sensor 130 faces the screen 120 and is located on a lower surface 1202 of the screen 120. After the screen 120 is lit up, the processor 110 controls image data within a visual persistence time of human eyes so that a grayscale value of the controlled image data is less than or equal to a first threshold, and the ambient light sensor 130 detects luminance of first ambient light of the wearable device within the visual persistence time of human eyes.

Further, the wearable device may include an FPC flexible board 140, the ambient light sensor 130 may be disposed on the FPC flexible board 140, and the ambient light sensor 130 may be connected to the processor 110 using the FPC flexible board 140. Optionally, the screen 120 may also be connected to the processor 110 using an FPC flexible board. The FPC flexible board for connecting the screen 120 to the processor 110 may be the same as or different from the FPC flexible board 140 for connecting the ambient light sensor 130 to the processor 110, and this is not limited in this embodiment.

It may be understood that the ambient light sensor 130 and the screen 120 may be both connected to the processor 110 directly or indirectly. Certainly, the processor 110 may be one processor, or may be a set of multiple processors. For example, the processor 110 includes an application processor and a baseband processor. The application processor and the baseband processor may be separately disposed, or may be integrated, and this is not limited in this embodiment of the present disclosure. In this embodiment, the processor 110 may be an application processor.

Further, referring to FIG. 2, the wearable device may further include an epoxy resin adhesive layer 1203. The epoxy resin adhesive layer 1203 is located on the lower surface 1202 of the screen 120, the ambient light sensor 130 is disposed in a hollow-out area of the epoxy resin adhesive layer 1203, and the screen 120 may be an OLED screen.

The epoxy resin adhesive layer 1203 in this embodiment may have different names according to different functions of the epoxy resin adhesive layer 1203, for example, a light-shielding epoxy resin adhesive layer having a light shielding function, a buffering epoxy resin adhesive layer having a buffering function, or a buffering and light-shielding epoxy resin adhesive layer having buffering and light shielding functions. The epoxy resin adhesive layer 1203 may be bonded to or directly placed on the lower surface 1202 of the screen 120. That is, the epoxy resin adhesive layer 1203 in this embodiment is unnecessarily adhesive, and this is not limited herein.

Further, a specific manner in which the processor 110 controls the image data so that the grayscale value of the controlled image data is less than or equal to the first threshold may be, for example, adjusting, by the processor 110, image data displayed on the screen 120 such that a grayscale value of the adjusted image data is less than or equal to the first threshold.

Further, the processor 110 may adjust image data that is being displayed on the screen 120 such that a grayscale value of the current image data is reduced and is less than or equal to the first threshold.

Alternatively, a specific manner in which the processor 110 controls the image data so that the grayscale value of the controlled image data is less than or equal to the first threshold may include inserting, by the processor 110, image data, where a grayscale value of the inserted image data is less than or equal to the first threshold.

Further, the processor 110 inserts new image data into image data that is being displayed on the current screen 120. A grayscale value of the new image data is less than or equal to the first threshold. In this case, the image data that is being displayed is overwritten by the new image data.

It should be noted that the first threshold in this embodiment is different from the first threshold in the first embodiment.

That the grayscale value of the image data is below the first threshold means that the image data is fully black or approximately black. For example, the first threshold is RGB (50, 50, 50). When grayscale values of R, G, and B of the image data are all less than or equal to 50, it may be considered that the image data is approximately black. In this case, an internal light ray of the screen 120 that can enter the ambient light sensor 130 is almost zero. For human eyes, the screen 120 is also almost black.

Figure 5:
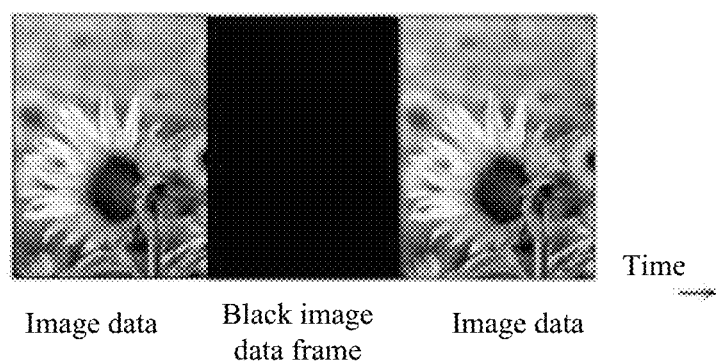
FIG. 5 is a schematic diagram of insertion of an approximately black image data frame into screen content according to an embodiment of the present disclosure.

The following provides brief descriptions using an example in which a grayscale value of inserted image data is less than or equal to a first threshold. FIG. 5 is a schematic diagram of insertion of an approximately black image data frame into content displayed on the screen in this embodiment of the present disclosure. As shown in FIG. 5, after a frame of image data is displayed, a frame of approximately black image is inserted. The image data that is being displayed may be overwritten by the frame of approximately black image. Because human eyes still view the previous frame of image data, viewing, by the human eyes, content displayed on the screen is not affected. The ambient light sensor completes detection on luminance of ambient light of the wearable device within a visual persistence time of human eyes.

The image data may be an image frame. For whether the ambient light sensor can complete detection within the visual persistence time of human eyes and within a time of the inserted approximately black image frame, in this embodiment of the present disclosure, the wearable device can adjust, according to a quantity of image frames, a quantity of inserted approximately black image frames. Provided that a total time length of the inserted approximately black image frames is less than the visual persistence time of human eyes, the ambient light sensor can complete detection on the luminance of the ambient light within the period of time.

Further, the processor is further configured to adjust the grayscale value of the image data according to the luminance of the first ambient light.

That the processor adjusts the grayscale value of the image data according to the luminance of the first ambient light may be include that if the luminance of the first ambient light is less than luminance that is of ambient light and that is detected by the ambient light sensor last time, the processor is further configured to detect whether there is a screen touch operation, and if there is no touch operation, the processor adjusts the grayscale value of the image data according to the luminance of the first ambient light.

That the processor controls the image data includes that the processor controls all image data in a screen area, or image data in a screen area in which the ambient light sensor is located.

After a screen of another wearable device in this embodiment of the present disclosure is lit up, when a processor controls image data within a visual persistence time of human eyes so that a grayscale value of the controlled image data is small enough, an internal light ray of the screen can be ignored, and an ambient light sensor completes detection on luminance of ambient light. This ensures that a light ray that enters the ambient light sensor is real ambient light. It should be noted that in order not to affect observation on screen content by human eyes, a process in which the processor controls the image data so that the grayscale value of the controlled image data is less than or equal to the first threshold, and a process in which the ambient light sensor detects the luminance of the ambient light of the wearable device need to be completed within one visual persistence time of human eyes. In this way, in a process in which the screen of the other wearable device in this embodiment of the present disclosure is lit up to display screen content, non-ambient light that enters the ambient light sensor is eliminated without being perceived by human eyes such that the ambient light sensor can detect luminance of relatively real ambient light.

An embodiment of the present disclosure further provides a corresponding method for detecting luminance of ambient light in the foregoing terminal embodiment.

Figure 6:
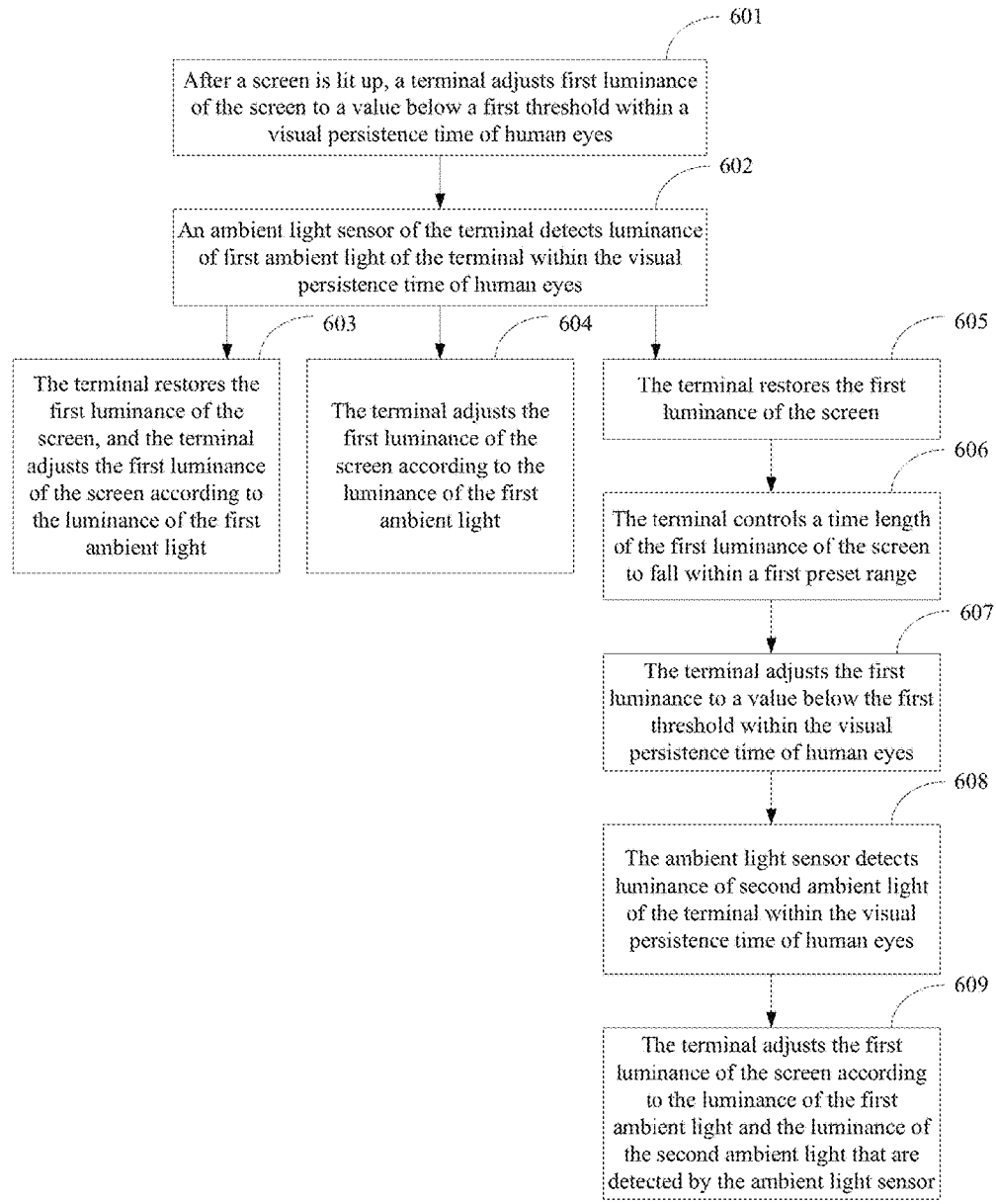
FIG. 6 is a schematic flowchart of a method for detecting luminance of ambient light according to an embodiment of the present disclosure.

Corresponding to the wearable device in the first embodiment of the present disclosure, FIG. 6 is a schematic flowchart of a method for detecting luminance of ambient light according to an embodiment of the present disclosure. As shown in FIG. 6, the method includes the following steps.

Step 601: After a screen is lit up, the terminal adjusts first luminance of the screen to a value below a first threshold within a visual persistence time of human eyes.

Further, the screen may be an OLED screen, and the terminal adjusts luminance of the OLED screen to a value below the first threshold, or when the screen is an LCD screen, the terminal adjusts backlight luminance of the LCD screen to a value below the first threshold.

Further, the terminal may not only adjust a value of the first luminance of the entire screen to a value below the first threshold, but also adjust, to a value below the first threshold, luminance of a screen area in which the ambient light sensor is located.

The first threshold may be 50 cd/cm$^2$.

Step 602: An ambient light sensor of the terminal detects luminance of first ambient light of the terminal within the visual persistence time of human eyes.

In this embodiment of the present disclosure, when the screen is lit up, the first luminance of the screen is adjusted to a value below the first threshold within the visual persistence time of human eyes. In this case, the ambient light sensor completes detection on the luminance of the ambient light of an environment in which the wearable device is located. In this way, in a process in which the screen of the wearable device is lit up to display screen content, non-ambient light that enters the ambient light sensor can be eliminated without being perceived by the human eyes such that the ambient light sensor can detect luminance of relatively real ambient light.

Further, after step 602, the method may further include the following step.

Step 603: The terminal restores the first luminance of the screen, and the terminal adjusts the first luminance of the screen according to the luminance of the first ambient light.

Further, that the terminal adjusts the first luminance of the screen according to the luminance of the first ambient light is further if the luminance of the first ambient light is less than luminance that is of ambient light and that is detected last time, the terminal detects whether there is a screen touch operation, and if there is no touch operation, the terminal adjusts the first luminance of the screen according to the luminance of the first ambient light.

After step 602, the method may further include the following step as an alternative to step 603.

Step 604: The terminal adjusts the first luminance of the screen according to the luminance of the first ambient light.

Further, that the terminal adjusts the first luminance of the screen according to the luminance of the first ambient light includes that if the luminance of the first ambient light is less than luminance that is of ambient light and that is detected last time, the terminal detects whether there is a screen touch operation, and if there is no touch operation, the terminal adjusts the first luminance of the screen according to the luminance of the first ambient light.

Because it is further determined whether there is a user's screen touch operation, a detection error is reduced.

After step 602, the method may further include step 605 to step 609 as an alternative to step 603 or step 604.

Step 605: The terminal restores the first luminance of the screen.

Step 606: The terminal controls a time length of the first luminance of the screen to fall within a first preset range.

The first preset range refers to a time length range within which a screen-on time length can ensure that a user can obtain screen content. The first preset range meets, for example, the following condition of 2× the visual persistence time of human eyes≤the first preset range≤1 s.

Step 607: The terminal adjusts the first luminance to a value below the first threshold within the visual persistence time of human eyes.

Step 608: The ambient light sensor detects luminance of second ambient light of the terminal within the visual persistence time of human eyes.

Step 609: The terminal adjusts the first luminance of the screen according to the luminance of the first ambient light and the luminance of the second ambient light that are detected by the ambient light sensor.

A manner of adjusting the first luminance of the screen according to the luminance of the first ambient light and the luminance of the second ambient light is the same as the adjustment method of the terminal shown in the first embodiment, and details are not described herein again.

Because luminance of ambient light is determined according to small-error results of two consecutive times of detection on luminance of ambient light, a detection result of the luminance of the ambient light is more accurate.

Figure 7:
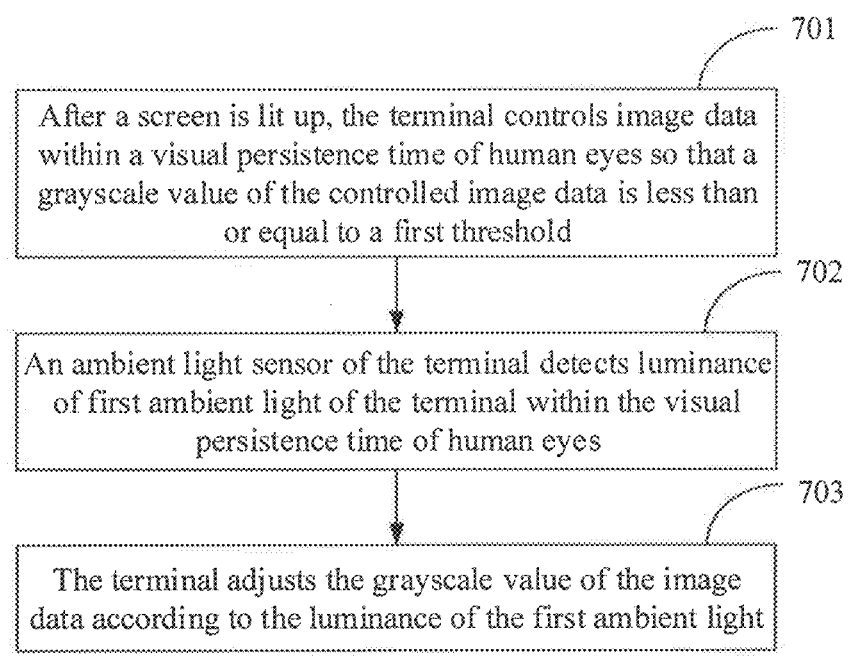
FIG. 7 is a schematic flowchart of another method for detecting luminance of ambient light according to an embodiment of the present disclosure.

Corresponding to the wearable device in the second embodiment of the present disclosure, FIG. 7 is a schematic flowchart of another method for detecting luminance of ambient light according to an embodiment of the present disclosure. As shown in FIG. 7, the method includes the following steps.

Step 701: After a screen is lit up, the terminal controls image data within a visual persistence time of human eyes so that a grayscale value of the controlled image data is less than or equal to a first threshold.

Further, the terminal may not only control all image data in a screen area, but also control image data in a screen area in which the ambient light sensor is located.

The first threshold is RGB (50, 50, 50).

Step 702: An ambient light sensor of the terminal detects luminance of first ambient light of the terminal within the visual persistence time of human eyes.

Further, after step 702, the method may further include step 703.

Step 703: The terminal adjusts the grayscale value of the image data according to the luminance of the first ambient light.

That the terminal adjusts the grayscale value of the image data according to the luminance of the first ambient light includes that if the luminance of the first ambient light is less than luminance that is of ambient light and that is detected by the ambient light sensor last time, the terminal detects whether there is a screen touch operation, and if there is no touch operation, the terminal adjusts the grayscale value of the image data according to the luminance of the first ambient light.

In this embodiment of the present disclosure, when a screen is lit up, image data is controlled within a visual persistence time of human eyes so that a grayscale value of controlled image data is less than or equal to a first threshold. In this case, an ambient light sensor completes detection on luminance of ambient light of a wearable device. In this way, in a process in which the screen of the wearable device is lit up to display screen content, non-ambient light that enters the ambient light sensor can be eliminated without being perceived by the human eyes such that the ambient light sensor can detect luminance of relatively real ambient light.

With descriptions of the foregoing implementation manners, a person skilled in the art may clearly understand that the present disclosure may be implemented by hardware, or a combination of software and hardware. The software may be stored in a computer readable medium. For example, the computer readable medium may include a read-only memory (ROM), a RAM, an electrically erasable programmable ROM (EEPROM), another compact disc or magnetic disk storage medium or another magnetic storage device, or any other medium that can be used to carry or store expected program code having an instruction or a data structural form and that can be accessed by a computer.

In summary, what is described above is merely examples of embodiments of the technical solutions of the present disclosure, but is not intended to limit the protection scope of the present disclosure. Any modification, equivalent replacement, or improvement made without departing from the spirit and principle of the present disclosure shall fall within the protection scope of the present disclosure.

What is claimed is:

1. A terminal, comprising:
   a screen;
   an ambient light sensor comprising a light-sensitive element facing the screen and located on a lower surface of the screen; and
   a processor coupled to the screen and the ambient light sensor and configured to:
   repeatedly adjust a first luminance of the screen to a value below a first threshold within a visual persistence time of human eyes detect luminance of first ambient light of the terminal within the visual persistence time of human eyes; and
   average two or more consecutive values of the first luminance of the first ambient light to produce an average luminance of the first ambient light when the two or more consecutive values of the first luminance of the first ambient light are within a second threshold.

2. The terminal of claim 1, wherein the processor is further configured to:
   restore the first luminance of the screen; and
   adjust the first luminance of the screen according to the luminance of the first ambient light of the terminal.

3. The terminal of claim 1, wherein the processor is further configured to adjust the first luminance of the screen according to the luminance of the first ambient light of the terminal.

4. The terminal of claim 1, wherein after the ambient light sensor detects the luminance of the first ambient light of the terminal within the visual persistence time of human eyes, the processor is further configured to:
   restore the first luminance of the screen;
   control a time length of the first luminance of the screen to fall within a first preset range; and
   adjust the first luminance of the screen to the value below the first threshold within the visual persistence time of human eyes,
   wherein the ambient light sensor is further configured to detect luminance of second ambient light of the terminal within the visual persistence time of human eyes, and
   wherein the processor is further configured to adjust the first luminance of the screen according to the luminance of the first ambient light of the terminal and the luminance of the second ambient light of the terminal that are detected by the ambient light sensor.

5. The terminal of claim 2, wherein when adjusting the first luminance of the screen, the processor is further configured to:
   detect whether there is a screen touch operation when the luminance of the first ambient light of the terminal is less than luminance of ambient light that is detected by the ambient light sensor last time; and
   adjust the first luminance of the screen according to the luminance of the first ambient light of the terminal when there is no touch operation.

6. The terminal of claim 1, wherein when adjusting the first luminance of the screen to the value below the first threshold, the processor is further configured to adjust luminance of an organic light-emitting diode screen to the value below the first threshold when the screen comprises the organic light-emitting diode screen.

7. The terminal of claim 1, wherein when adjusting the first luminance of the screen to the value below the first threshold, the processor is further configured to adjust, to the value below the first threshold, luminance of a screen area in which the ambient light sensor is located.

8. The terminal of claim 1, further comprising an epoxy resin adhesive layer, wherein the epoxy resin adhesive layer is located on the lower surface of the screen, wherein the ambient light sensor is disposed in a hollowed-out area of the epoxy resin adhesive layer, and wherein the screen is an organic light-emitting diode screen.

9. A terminal, comprising:
   a screen;
   an ambient light sensor, wherein a light-sensitive element of the ambient light sensor faces the screen and is located on a lower surface of the screen; and
   a processor coupled to the screen and the ambient light sensor and configured to:
      repeatedly control image data within a visual persistence time of human eyes after the screen is lit up to make a grayscale value of the controlled image data is less than or equal to a first threshold; and
      average two or more consecutive values of luminance of first ambient light to produce an average luminance of the first ambient light when the two or more consecutive values of the luminance of the first ambient light are within a second threshold,
   wherein the ambient light sensor is configured to detect luminance of first ambient light of the terminal within the visual persistence time of human eyes.

10. The terminal of claim 9, wherein when controlling the image data, the processor is further configured to adjust image data displayed on the screen to make a grayscale value of the adjusted image data is less than or equal to the first threshold.

11. The terminal of claim 9, wherein when controlling the image data, the processor is further configured to insert image data, and wherein a grayscale value of the inserted image data is less than or equal to the first threshold.

12. The terminal of claim 9, wherein the processor is further configured to adjust the grayscale value of the image data according to the luminance of the first ambient light of the terminal.

13. The terminal of claim 12, wherein when adjusting the grayscale value of the image data, the processor is further configured to:
   detect whether there is a screen touch operation when the luminance of the first ambient sensor last time; and
   adjust the grayscale value of the image data according to the luminance of the first ambient light of the terminal when there is no touch operation.

14. The terminal of claim 9, wherein when controlling the image data, the processor is further configured to:
   control all image data in a screen area; or
   control image data in a screen area in which the ambient light sensor is located.

15. The terminal of claim 9, further comprising an epoxy resin adhesive layer located on the lower surface of the screen, wherein the ambient light sensor is disposed in a hollowed-out area of the epoxy resin adhesive layer, and wherein the screen is an organic light-emitting diode screen.

16. A method for detecting luminance of ambient light, comprising:
   adjusting, by a terminal, first luminance of a screen to a value below a first threshold within a visual persistence time of human eyes after the screen of the terminal is lit up;
   detecting, by an ambient light sensor of the terminal, luminance of first ambient light of the terminal within the visual persistence time of human eyes; and
   average two or more consecutive values of luminance of the first ambient light to produce an average luminance of the first ambient light when the two or more consecutive values of the luminance of the first ambient light are within a second threshold.

17. The method of to claim 16, wherein after detecting the luminance of first ambient light of the terminal within the visual persistence time of human eyes, the method further comprises:
   restoring, by the terminal, the first luminance of the screen; and
   adjusting, by the terminal, the first luminance of the screen according to the luminance of the first ambient light of the terminal.

18. The method of claim 16, wherein after detecting the luminance of first ambient light of the terminal within the visual persistence time of human eyes, the method further comprises adjusting, by the terminal, the first luminance of the screen according to the luminance of the first ambient light of the terminal.

19. The method of claim 16, wherein after detecting the luminance of the first ambient light of the terminal within the visual persistence time of human eyes, the method further comprises:
   restoring, by the terminal, the first luminance of the screen;
   controlling, by the terminal, a time length of the first luminance of the screen to fall within a first preset range;
   adjusting, by the terminal, the first luminance of the screen to the value below the first threshold within the visual persistence time of human eyes;
   detecting, by the ambient light sensor, luminance of second ambient light of the terminal within the visual persistence time of human eyes; and
   adjusting, by the terminal, the first luminance of the screen according to the luminance of the first ambient light of the terminal and the luminance of the second ambient light of the terminal that are detected by the ambient light sensor.

20. The method of claim 17, wherein adjusting the first luminance of the screen comprises:
   detecting, by the terminal, whether there is a screen touch operation when the luminance of the first ambient light of the terminal is less than luminance of ambient light that is detected last time; and
   adjusting, by the terminal, the first luminance of the screen according to the luminance of the first ambient light of the terminal when there is no touch operation.

* * * * *